(12) United States Patent
Tao et al.

(10) Patent No.: US 6,235,440 B1
(45) Date of Patent: May 22, 2001

(54) METHOD TO CONTROL GATE CD

(75) Inventors: Hun-Jan Tao; Huan-Just Lin; Fang-Cheng Chen, all of Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/434,563

(22) Filed: Nov. 12, 1999

(51) Int. Cl.⁷ ....................................... G03F 9/00
(52) U.S. Cl. ............... 430/30; 430/313; 438/14; 438/16; 438/949
(58) Field of Search ............... 430/30, 313; 438/14, 438/16, 949

(56) References Cited

U.S. PATENT DOCUMENTS

| 4,717,445 | 1/1988 | Leung | 156/626 |
| 5,057,187 | 10/1991 | Shinagawa et al. | 156/643 |
| 5,674,409 | 10/1997 | Muller | 216/41 |
| 5,804,460 | 9/1998 | Bindell et al. | 438/16 |
| 5,913,102 | 6/1999 | Yang | 438/14 |

*Primary Examiner*—Christopher G. Young
(74) *Attorney, Agent, or Firm*—George O. Saile; Stephen B. Ackerman

(57) ABSTRACT

The invention is a process for reducing variations in CD from wafer to wafer. It begins by increasing all line widths in the original pattern data file by a fixed amount that is sufficient to ensure that all lines will be wider than the lowest acceptable CD value. Using a reticle generated from this modified data file, the pattern is formed in photoresist and the resulting CD value is determined. If this turns out be outside (above) the acceptable CD range, the amount of deviation from the ideal CD value is determined and fed into suitable software that calculates the control parameters (usually time) for an ashing routine. After ashing, the lines will have been reduced in width by the amount necessary to obtain the correct CD. A fringe benefit of this trimming process is that edge roughness of the photoresist lines is reduced and line feet are removed.

20 Claims, 3 Drawing Sheets

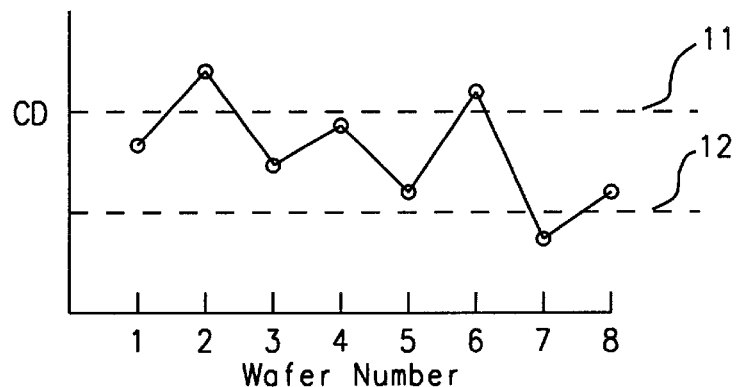
FIG. 1 – Prior Art
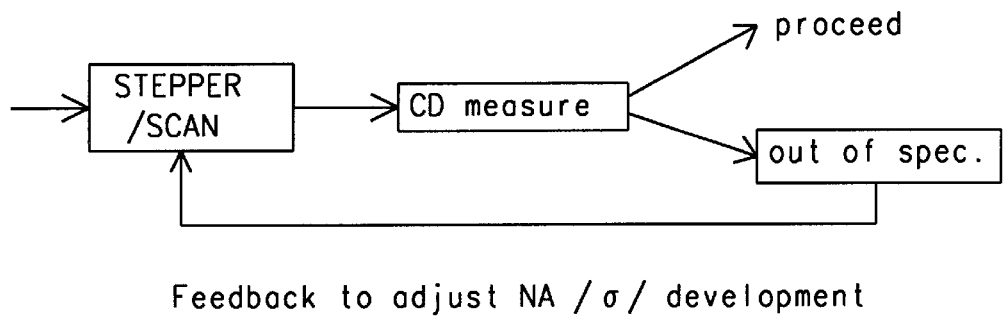
Feedback to adjust NA /σ/ development
FIG. 2 – Prior Art
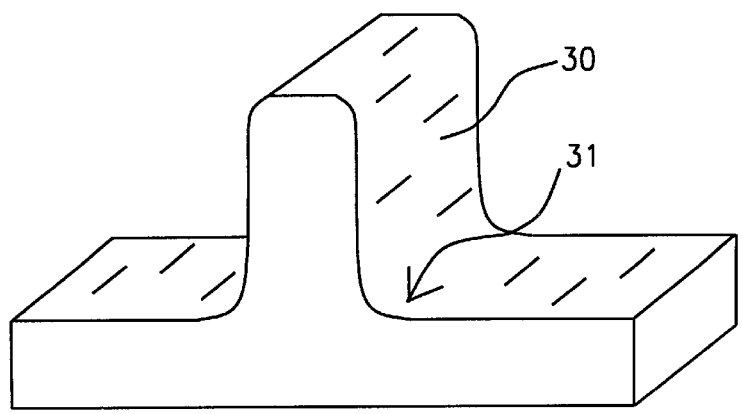
FIG. 3a – Prior Art

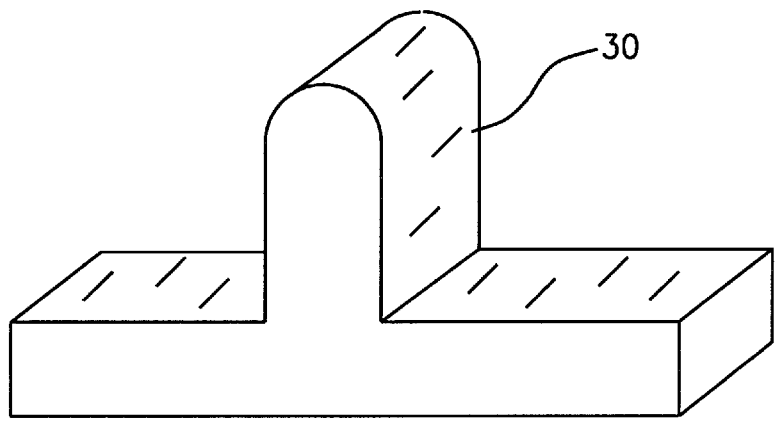
FIG. 3b – Prior Art
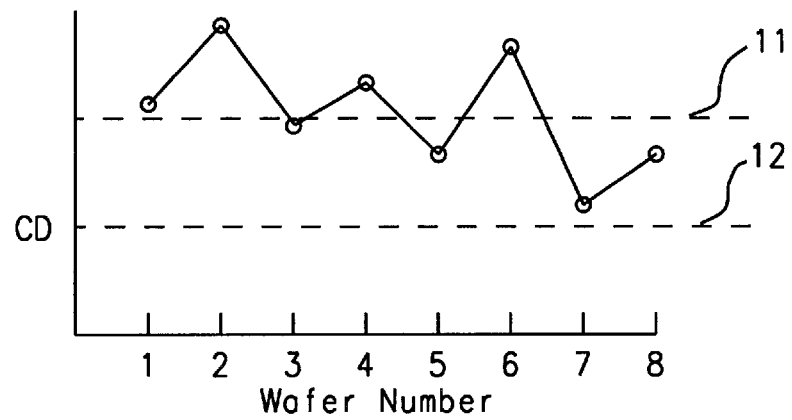
FIG. 4
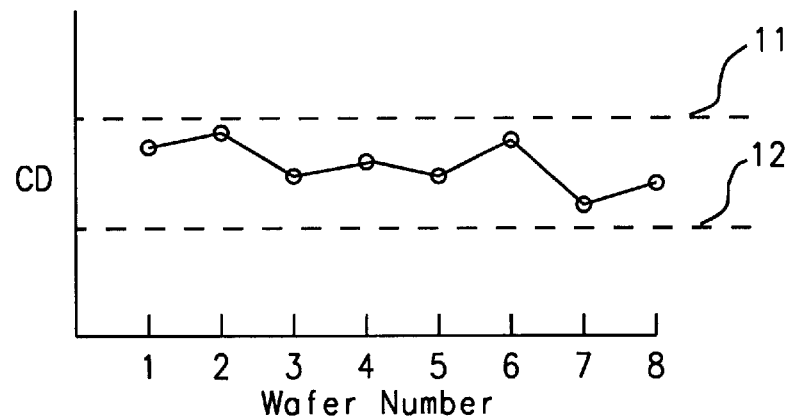
FIG. 5

METHOD TO CONTROL GATE CD

FIELD OF THE INVENTION

The invention relates to the general field of pattern formation through photolithography with particular reference to batch to batch uniformity control.

BACKGROUND OF THE INVENTION

The manufacture of integrated circuits involves laying down many layers of different materials each of which is formed into a different pattern using standard photolithographic techniques. In general, one wafer is processed at a time so that differences in the widths of lines of the actual photoresist patterns will vary somewhat from wafer to wafer. An example of this is illustrated in FIG. 1 which shows the CD (critical dimension or minimum width) for lines that were formed using the same reticle, or mask, on eight different wafers.

Lines 11 and 12 in FIG. 1 represent the upper and lower bounds for the CD to fall within the specified limits. In this example, wafers 2 and 6 had a CD that was too high while wafer 7 had a CD that was too low. Variations of this sort are the result of small, but unavoidable, changes that take place during exposure and subsequent processing of the photoresist. These include such factors as the numerical aperture and depth of focus of the optical reduction system as well as the times and temperatures used to develop the photoresist.

The most common approach to dealing with this in the prior art has been to simply strip off the photoresist whenever the CD is found to be out of spec. and then start again. This can be expensive and does not guarantee that the problem will not arise again.

A somewhat more sophisticated approach used in the prior art is to measure the wafers as in their patterns are generated, accepting those that are within spec and then using the out of spec data to adjust the full photolithographic process (numerical aperture, development parameters, etc.). A flow chart representation of this method is shown in FIG. 2. While this approach reduces the wafer to wafer variations in CD it is not sufficiently reliable to allow removal of the feedback loop once the system appears to have settled down. Additionally, deciding what changes are to be made to the photolithographic process, based on the measured CDs, can be quite complicated and difficult to implement.

Another problem associated with the photolithography of fine lines is that of edge roughness and foot formation. Inevitably the edges of lines formed in photoresist cannot be completely straight and a certain amount of ripple will appear. As lines get to be finer and finer this edge roughness begins to be a significant fraction of the actual line width. In FIG. 3a we show an example of foot formation in a line of photoresist. Line 30 is about 0.16 microns wide and about 0.38 microns high. Foot 31 can be seen extending about 0.015 microns outward at its base. The presence of the foot introduces a level of uncertainty into the width of any line that is subsequently etched using this line of photoresist as a mask. The prior art process discussed above provides no correction for either the roughness problem the line foot problem.

Also used in the prior art is a process whereby the width of the photoresist lines can be reduced by exposing them to a gas plasma discharge. This approach is satisfactory when the measured CD of the photoresist lines is too high (such as for wafers 2 and 6 in FIG. 1), but cannot be used when the CD is too low (such as for wafer 7 in FIG. 1). An example of a photoresist line whose foot has been removed through exposure to a gas discharge plasma is shown in FIG. 3b.

A routine search of the prior art was conducted but no references teaching the exact method of the present invention were found. Several references of interest were, however, seen. For example, Yang (U.S. Pat. No. 5,913,102) shows a system for controlling CD using a measurement parameter and a control parameter. Yang does not specifically discuss photoresist trimming processes related to CD of gates Muller et al (U.S. Pat. No. 5,674,409) show a photoresist trimming process that uses ashing while Shinagawa et al. (U.S. Pat. No. 5,057,187) show a method of controlling such an ashing process.

Leung (U.S. Pat. No. 4,717,445) shows an etch bias monitoring technique while Bindell et al. (U.S. Pat. No. 5,804,460) show a method for measuring photoresist line widths.

SUMMARY OF THE INVENTION

It has been an object of the present invention to provide a process for limiting variations in line width of photoresist patterns from wafer to wafer.

Another object of the invention has been to provide a process for reducing edge roughness in photoresist lines.

Still another object of the invention has been to provide a process for removing feet in photoresist lines.

A further object of the invention has been that said process be low cost and suitable for photoresist lines that are both too wide and too narrow.

These objects have been achieved by increasing all line widths in the original pattern data file by a fixed amount that is sufficient to ensure that all lines will be wider than the lowest acceptable CD value. Using a reticle generated from the modified data file, the pattern is formed in photoresist and the resulting CD value is determined. If this turns out be outside (above) the acceptable CD range, the amount of deviation from the ideal CD value is determined and fed into suitable software that calculates the control parameters (usually time) for an ashing routine. After ashing, the lines will have been reduced in width by the amount necessary to obtain the correct CD. A fringe benefit of this trimming process is that edge roughness of the photoresist lines is reduced and line feet are removed.

BRIEF DESCRIPTION OF THE DRAWINGS

FIG. 1 is an example of CD variation across a group of several wafers.

FIG. 2 is a flow chart illustration of a prior art process that has been used to improve the distribution seen in FIG. 1.

FIG. 3a shows a photoresist line that has a foot.

FIG. 3b shows a photoresist line from which the foot has been removed due to exposure to a gas plasma discharge.

FIG. 4 shows CD variation across several wafers when a mask having its CD increased according to the process of the present invention is used.

FIG. 5 shows the distribution of FIG. 4 after controlled trimming, according to the present invention, has taken place.

DESCRIPTION OF THE PREFERRED EMBODIMENTS

Figure 6:
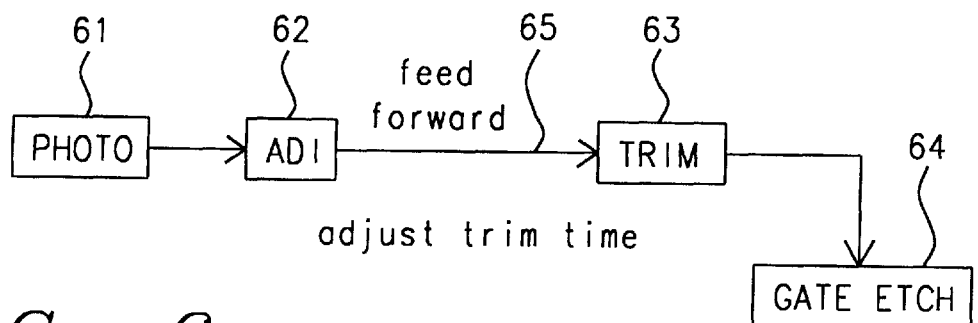
FIG. 6 is a flowchart illustration of the process of the present invention.

The present invention is concerned with improved dimensional control of photoresist masks. We will illustrate the process of the invention using as an example the formation of a polysilicon gate that is part of an integrated circuit, but it will be understood by those skilled in the art that the process is more general than this, being applicable to the control of line width in general when photoresist masking is used.

The process begins with the provision of a mask generation data file. Said file contains all the data necessary to generate the image that is to be replicated in photoresist. This includes data on those lines whose width is the lowest of all lines in the pattern. In other words, these are the line widths that define the critical dimension (CD) of the pattern. Typically, the CD width would be between about 0.14 and 0.18 microns.

The next step in the process is to modify the data file by increasing the widths of all lines in the pattern by a fixed amount which is usually in the range of from about 0.01 to about 0.03 microns. The precise value of this width increase depends on the past history of CD variation from wafer to wafer as already discussed and illustrated in FIG. 1. Specifically, the CD is increased by a sufficient amount to ensure that the CD of the photoresist mask is greater than the lower bound 12 for all future wafers. This would result in the distribution seen in FIG. I having the appearance shown in FIG. 4. In other words, all future photoresist patterns will have CDs that are either within spec. (being between upper and lower bounds 11 and 12), or CDs that are too large (such as wafers 2, 4, and 6 in FIG. 4) but never too small (such as wafer 7 in FIG. 1).

The modified file is now used to generate a reticle in the usual way. Said reticle is now ready for use in the same optical reduction system that was used prior to the present invention for exposing the photoresist, care being taken to ensure that optical parameters such as numerical aperture, depth of focus, etc. remain unaltered as well as the various parameters associated with processing the photoresist With the modified reticle now available, the semiconductor wafer to which the process is to be applied is covered with a layer of polysilicon to a thickness between about 0.15 and 0.35 microns. This is followed by the deposition of a layer of material that is suitable for use as a hard mask such as silicon oxide, silicon nitride, or silicon oxynitride, to a thickness between about 0.4 and 0.8 microns. Optionally, if some material other than polysilicon is to be etched, the hard mask material layer might be omitted.

The hard mask layer is now coated with photoresist following which it is exposed to actinic radiation that illuminates its surface with an image that is a reduced version of the pattern contained in the (modified) reticle. The photoresist is then developed in the usual way to form a photoresist pattern. As already discussed above, the CD of this pattern may be too large but, by definition, it cannot be too small.

The exact amount by which the CD of the photoresist pattern on any given wafer exceeds the specified dimension is then determined by inspection. For wafers in which the CD of their photoresist pattern falls within the permitted range nothing further need be done. In the current example this would be wafers 3, 5, 7, and 8 (in FIG. 4). However, for wafers such as number 3, that are only just within spec., there is some advantage to including them among the candidates for rework, as will be discussed below, along with wafers 2, 4, and 6 that are clearly outside the permitted range (CD above line 1).

Figure 7:
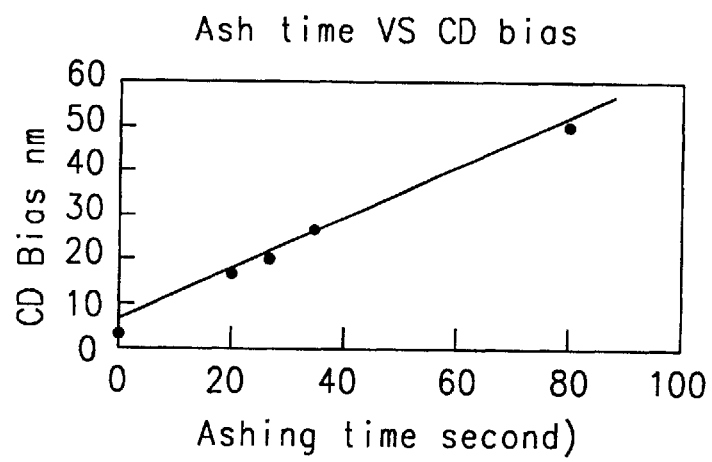
FIG. 7 is a plot of CD bias as a function of ashing time.

The amount by which the measured CD in the developed photoresist exceeds the CD of the original (unmodified) data file is then used as a parameter to control the next step in the process which is trimming of the photoresist mask through exposure to a gas discharge etcher. The larger this control parameter, the longer the exposure time and/or the power level of the discharge will be. A typical trimming sequence would be to use a mixture of chlorine and oxygen gases, in a conductive or inductive etcher, at a power level between about 200 and 300 watts, for between about 20 and 60 seconds. An example of how much the width of a line of photoresist is reduced (referred to as 'CD bias') as a function of the ashing time is shown in FIG. 7. It is apparent that this method allows line widths to be controlled to an accuracy of better than about 0.01 nm.

At the conclusion of this trimming process, the widths of all lines in the photoresist pattern will have been reduced to a value that falls between lines 11 and 12 in FIG. 4 so that the distribution of CDs among the photoresist patterns on the different wafers would have the appearance illustrated in FIG. 5. That is, all wafer patterns now have CDs that are within spec.

Normal processing is now resumed. The hard mask layer is etched using standard techniques, with the trimmed photoresist pattern serving as the mask, thereby forming the actual hard mask which is then used for the etching of the polysilicon layer to form a gate.

Figure 8:
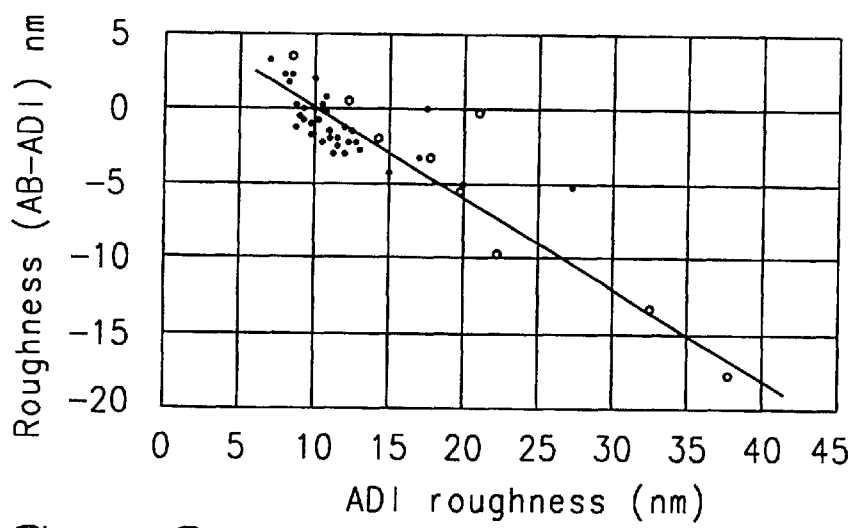
FIG. 8 is a plot of post trimming improvement of roughness as function of edge roughness prior to trimming.

An important fringe benefit of the trimming process described above is that, in addition to reducing photoresist line width, it also reduces the edge roughness of the lines as well. This is an important property for a device gate so lines that are only just within the specified width range may also be given a slight trim since there is no danger of reducing their widths to less than the CD spec. An illustration of this can be seen for wafer 3 (of this example) which, in FIG. 4, is seen to be just within spec. but, after a slight trim, has had its width reduced somewhat but still remains well within spec. In practice, the lines in the photoresist image, prior to trimming, have an edge roughness between about 15 and 25 nm while the lines in the photoresist image, after trimming, have an edge roughness between about 10 and 15. FIG. 8 is a plot of post trimming roughness improvement vs. pre-trimming roughness and shows that the lower the initial roughness the greater the improvement that can be obtained through trimming.

A flow chart summarizing the above-described process, is shown in FIG. 6. Box 61 refers to the formation of the photoresist pattern using the modified reticle. Once formed this pattern is inspected, that is its CD is measured, as symbolized by box 62, ADI being 'after development inspection'. Based on the results of the ADI, suitable software is used to translate the difference in CDs to control data for the trimming process (connector line 65). This is followed by the actual trimming operation (box 63) and, finally, etching takes place using the trimmed photoresist as a mask. In this example it is a transistor gate that is being formed (box 64).

The effectiveness of the present invention in reducing CD variation from wafer to wafer is illustrated by the data summarized in TABLE I below. CD values and 3 sigma values for two processes are shown at several stages in the formation of a polysilicon gate.

TABLE I

|  | 0.18 microns | | 0.35 microns | |
| --- | --- | --- | --- | --- |
|  | CD(microns) | 3σ(nm) | CD(microns) | 3σ(nm) |
| ADI | 0.174 | 9.6 | 0.3453 | 7.5 |
| post trimming & HM open ASI | 0.1505 | 7.8 | 0.3204 | 5.4 |
| HM ASI-ADI(nm) | −21.5 | 2.4 | −22.9 | 4.8 |
| poly ASI | 0.1477 | 7.5 | 0.3119 | 5.3 |
| poly ASI-HM ASI | −8.8 | 3.6 | −8.5 | 3 |
| poly ASI-ADI(nm) | −30.3 | 3.3 | −31.4 | 4.8 |

Abbreviations used in TABLE I are ADI=after development inspection, HM=hard mask, ASI=after stripping inspection.

By using ADI CD feedforward control of 0.18 and 0.25 micron lines, we can reduce the CD variation found during ADI from 9.6 nm to 7.8 nm found during HMASI, for 0.18 micron lines, and from 7.5 nm to 5.4 nm for 0.35 micron lines. Thus feed forwarding ADI CD data to the HMASI by the trimming method, as disclosed above, improves the wafer-to-wafer CD variation.

While the invention has been particularly shown and described with reference to the preferred embodiments thereof, it will be understood by those skilled in the art that various changes in form and details may be made without departing from the spirit and scope of the invention.

What is claimed is:

1. A process to control line width after etching, comprising:

providing a mask generation data file, including data on lines having a first minimum width;

modifying the data file whereby said first minimum width is increased by an amount;

from said modified file, forming a reticle;

coating a semiconductor wafer, having a top layer, with photoresist and then exposing said photoresist to an image of said reticle and then developing the photoresist to form a photoresist image;

inspecting said photoresist image thereby determining a second minimum width;

based on the difference between the first and second minimum widths, generating a control sequence for photoresist trimming;

then trimming the photoresist image according to said control sequence; and then etching said top layer, using the trimmed photoresist image as a mask.

2. The process of claim 1 wherein said first minimum width is between about 0.14 and 0.18 microns.

3. The process of claim 1 wherein said second minimum width is between about 0.12 and 0.16 microns.

4. The process of claim 1 wherein the amount by which the first minimum width is increased is between about 0.01 and 0.03 microns.

5. The process of claim 1 wherein said trimming control sequence further comprises using a mixture of chlorine and oxygen gases, in a conductive or inductive etcher, at a power level between about 200 and 300 watts, for between about 20 and 60 seconds.

6. The process of claim 1 wherein the coating of photoresist has a thickness between about 0.3 and 0.5 microns.

7. A process to reduce edge roughness of lines in a photoresist pattern, comprising:

providing a mask generation data file, including data on lines having a first minimum width;

modifying the data file whereby said first minimum width is increased by an amount;

from said modified file, forming a reticle;

coating a semiconductor wafer, having a top layer, with photoresist and then exposing said photoresist to an image of said reticle and then developing the photoresist to form a photoresist image of the lines;

inspecting said photoresist image thereby determining a second minimum width;

based on the difference between the first and second minimum widths, generating a control sequence for photoresist trimming; and then trimming the photoresist image according to said control sequence, thereby reducing edge roughness of the lines.

8. The process of claim 7 wherein the lines in the photoresist image, prior to trimming, have an edge roughness between about 15 and 25 nm.

9. The process of claim 7 wherein the lines in the photoresist image, after trimming, have an edge roughness between about 10 and 15 nm.

10. The process of claim 7 wherein said trimming control sequence further comprises using a mixture of chlorine and oxygen gases, in a conductive or inductive etcher, at a power level between about 200 and 300 watts, for between about 20 and 60 seconds.

11. A process for width control of a polysilicon gate, comprising:

providing a mask generation data file, including data on lines having a first minimum width;

modifying the data file whereby said first minimum width is increased by an amount;

from said modified file, forming a reticle;

providing a semiconductor wafer having a top layer of polysilicon depositing a layer of a hard mask material on said polysilicon layer;

coating the hard mask layer with photoresist and then exposing said photoresist to an image of said reticle and then developing the photoresist to form a photoresist image;

inspecting said photoresist image thereby determining a second minimum width;

based on the difference between the first and second minimum widths, generating a control sequence for photoresist trimming;

then trimming the photoresist image according to said control sequence;

then etching said hard mask layer, using the trimmed photoresist image as a mask, thereby forming a hard mask; and then etching the polysilicon layer to form a gate.

12. The process of claim 11 wherein the amount by which the first minimum width is increased is between about 0.01 and 0.03 microns.

13. The process of claim 11 wherein said trimming control sequence further comprises using a mixture of chlorine and oxygen gases, in a conductive or inductive etcher, at a power level between about 200 and 300 watts, for between about 20 and 60 seconds.

14. The process of claim 11 wherein the polysilicon layer has a thickness between about 0.15 and 0.35 microns.

15. The process of claim 11 wherein the hard mask layer is selected from the group consisting of silicon oxide, silicon nitride, and silicon oxynitride.

16. The process of claim 11 wherein the hard mask layer has a thickness between about 0.04 and 0.08 microns.

17. A process to reduce edge roughness of a semiconductor gate line, having a first width, comprising:

provoding a mask generation data file, including data on said first the gate width;

modifying the data file whereby said first line width is increased by an amount;

from said modified file, forming a reticle;

providing a semiconductor wafer having a top layer of polysilicon depositing a layer of a hard mask material on said polysilicon layer;

coating the hard mask layer with photoresist and then exposing said photoresist to an image of said reticle and then developing the photoresist to form a photoresist image;

inspecting said photoresist image thereby determining a second gate width;

based on the difference between the first and second gate widths, generating a control sequence for photoresist trimming;

then trimming the photoresist image according to said control sequence;

then etching said hard mask layer, using the trimmed photoresist image as a mask, thereby forming a hard mask; and then etching the polysilicon layer to form a gate having reduced edge roughness.

18. The process of claim 17 wherein the lines in the photoresist image, prior to trimming, have an edge roughness between about 15 and 25 nm.

19. The process of claim 17 wherein the lines in the photoresist image, after trimming, have an edge roughness between about 10 and 15 nm.

20. The process of claim 17 wherein said trimming control sequence further comprises using a mixture of chlorine and oxygen gases, in a conductive or inductive etcher, at a power level between about 200 and 300 watts, for between about 20 and 60 seconds.

* * * * *